(12) United States Patent
Zhong et al.

(10) Patent No.: US 9,018,737 B2
(45) Date of Patent: Apr. 28, 2015

(54) SUBMOUNT ASSEMBLY INTEGRATION

(71) Applicant: Seagate Technology LLC, Cupertino, CA (US)

(72) Inventors: Lijuan Zhong, Eden Prairie, MN (US); Edward Charles Gage, Lakeville, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/787,405

(22) Filed: Mar. 6, 2013

(65) Prior Publication Data
US 2014/0252560 A1    Sep. 11, 2014

(51) Int. Cl.
*H01L 23/44* (2006.01)
*H01S 5/022* (2006.01)

(52) U.S. Cl.
CPC ......... *H01S 5/02252* (2013.01); *H01S 5/02272* (2013.01); *H01S 5/02276* (2013.01)

(58) Field of Classification Search
CPC ............ H01S 5/02252; H01S 5/02276; G11B 5/4826
USPC ......... 257/620, 779; 369/13.01, 13.02, 13.32, 369/13.35
See application file for complete search history.

(56) References Cited

U.S. PATENT DOCUMENTS

| | | |
|---|---|---|
| 5,767,010 A | 6/1998 | Mis et al. |
| 7,929,248 B2 | 4/2011 | Zhu et al. |
| 8,456,961 B1 * | 6/2013 | Wang et al. ................ 369/13.01 |
| 8,681,594 B1 * | 3/2014 | Shi et al. .................. 369/112.27 |
| 2009/0052076 A1 | 2/2009 | Shimazawa et al. |
| 2009/0225636 A1 | 9/2009 | Hirano et al. |
| 2011/0090770 A1 | 4/2011 | Iwanabe et al. |
| 2011/0266469 A1 | 11/2011 | Goulakov et al. |
| 2012/0008470 A1 | 1/2012 | Shimazawa et al. |

OTHER PUBLICATIONS

Schurz et al., "Duel Side Lithography Measurement, Precision and Accuracy", Ultratech, Inc., San Jose, CA, SPIE 2005 #5752-97.
International Search Report and Written Opinion of PCT/US2014/019320, mailed Jul. 11, 2014, 11 pages.

* cited by examiner

*Primary Examiner* — Brook Kebede
(74) *Attorney, Agent, or Firm* — HolzerIPLaw, PC

(57) ABSTRACT

In accordance with one embodiment, an apparatus is disclosed that comprises a submount operable to integrate with a laser as a laser submount assembly; a predetermined portion of the submount configured to bond with the laser; a bonding pad positioned on the predetermined portion of the submount for integrating the laser with the submount.

9 Claims, 7 Drawing Sheets

SUBMOUNT ASSEMBLY INTEGRATION

BACKGROUND

Magnetic media storage devices have relatively recently begun to use heat assisted magnetic recording (also known as HAMR). One implementation of heat assisted magnetic recording is to use a laser, such as a laser diode, affixed to an assembly that is positioned on a slider. The laser is used to heat a targeted portion of the magnetic medium, such as a disk. Due to the small scale of the devices used, proper alignment of the laser relative to the slider can be an issue.

SUMMARY

In accordance with one embodiment, an apparatus is disclosed that includes a submount operable to integrate with a laser as a laser submount assembly; a predetermined portion of the submount configured to bond with the laser; and a bonding pad positioned on the predetermined portion of the submount for integrating the laser with the submount.

In accordance with another embodiment, an apparatus is disclosed that includes a slider comprising an air bearing surface and a waveguide surface; and a mechanical stop configured to align a submount in a predetermined position.

In yet another embodiment, a method is disclosed that includes forming a mechanical stop on a slider in a predetermined position, wherein the predetermined position is operative to align a submount on the slider.

Further embodiments will be apparent to those of ordinary skill in the art from a consideration of the following description taken in conjunction with the accompanying drawings, wherein certain methods, apparatuses, and articles of manufacture are illustrated. This summary is provided merely to introduce certain concepts rather than to identify any key or essential features of the claimed subject matter.

BRIEF DESCRIPTION OF THE DRAWINGS

A further understanding of the nature and advantages of the present technology may be realized by reference to the figures, which are described in the remaining portion of the specification.

DETAILED DESCRIPTION

Embodiments of the present technology are disclosed herein in the context of a disc drive system. However, it should be understood that the technology is not limited to a disc drive system and could readily be applied to other technology systems as well.

Figure 1:
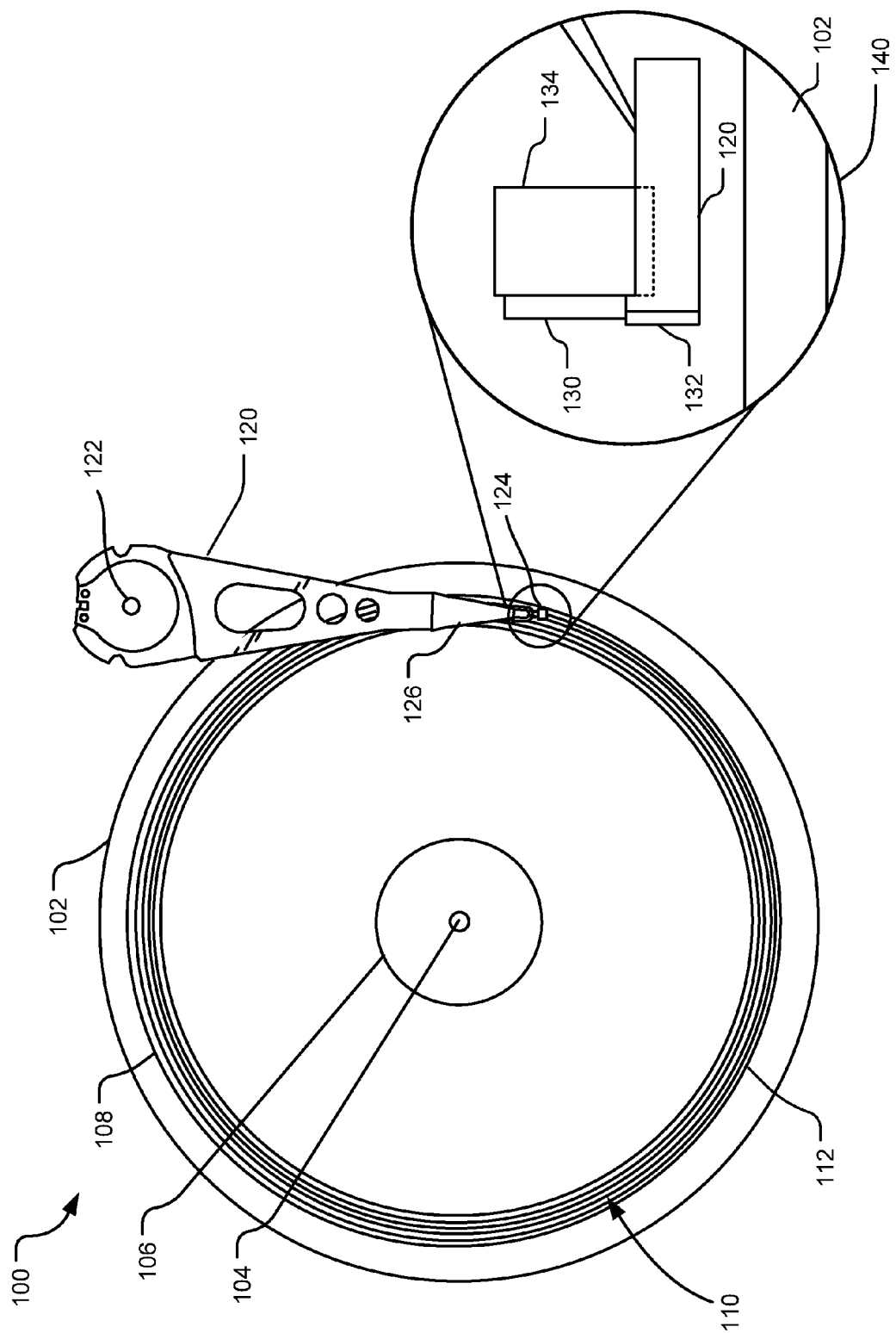
FIG. 1 illustrates an example of a disc drive in which a submount assembly may be utilized, in accordance with one embodiment.

With reference now to FIG. 1, an example of a disc drive system in accordance with one embodiment is shown. A disc drive system is but one example where disclosed technology may be utilized. FIG. 1 illustrates a perspective view 100 of an example transducer head using heat assisted magnetic recording. A disc 102 rotates about a spindle center or a disc axis of rotation 104 during operation. The disc 102 includes an inner diameter 106 and an outer diameter 108 between which are a number of concentric data tracks 110, illustrated by circular lines. It should be understood, however, that the described technology may be employed with other types of storage media, including patterned magnetic media, discrete track (DT) media, etc.

Information may be written to and read from recorded magnetic domains on the disc 102 in different data tracks 110. A transducer head 124 is shown mounted on an actuator assembly 120 at an end distal to an actuator axis of rotation 122. The transducer head 124 flies in close proximity above the surface of the disc 102 during disc operation. The actuator assembly 120 rotates during a seek operation about the actuator axis of rotation 122 positioned adjacent to the disc 102. The seek operation positions the transducer head 124 over a target data track of the data tracks 110.

The exploded view 140 shows slider 120 attached to a laser submount assembly 134 having a laser light source 130 (e.g., a laser diode) or other light source (e.g., a light emitting diode (LED)). The laser submount assembly 134 is integrated with the slider 120. In one implementation, the integration can be accomplished utilizing a bonding pad and/or bonding cavity (designated by the dashed lines), as discussed in more detail below. Other types of coupling may be utilized as well.

The slider 120 can include a writer section (not shown) having a main write pole magnetically coupled to a return or opposing pole by a yoke or pedestal. A magnetization coil surrounds the yoke or pedestal to induce magnetic write pulses in the write pole. In other implementations, the slider 120 may be constructed without a yoke or return pole. The slider 120 may also include one or more read sensors (not shown) for reading data off of the media.

Light from the laser light source 130 is shown directed through a waveguide 132 on the trailing edge of the slider 120. Using the waveguide, the light can then be redirected and/or focused on a point on the media in close proximity to the write pole on the slider 120. A near-field transducer (NFT) may also be mounted on the slider 120 to further concentrate the light on the point on the media or the disc 102. In another implementation, one or more of the laser light source 130, waveguide 132, mirrors (not shown), and/or NFTs (not shown) are mounted on an area of the slider 120 other than the trailing surface.

By using a laser coupled with the write head, a heat-assisted magnetic recording (HAMR) recording technique can be utilized. A HAMR system allows the light from the laser to heat a portion of the magnetic recording media prior to a write operation being performed. The light from the laser can be focused via a waveguide on a precise location of the magnetic media prior to the write head performing a write operation. This allows improved areal density to be achieved. A HAMR head thus allows the laser to be situated precisely so that the laser can be directed at the desired location on the magnetic recording media. One way of mounting the laser on the write head is to utilize a submount device. This allows the laser to be mounted on the slider. A laser diode can be utilized as the laser in accordance with one embodiment.

Figure 2:
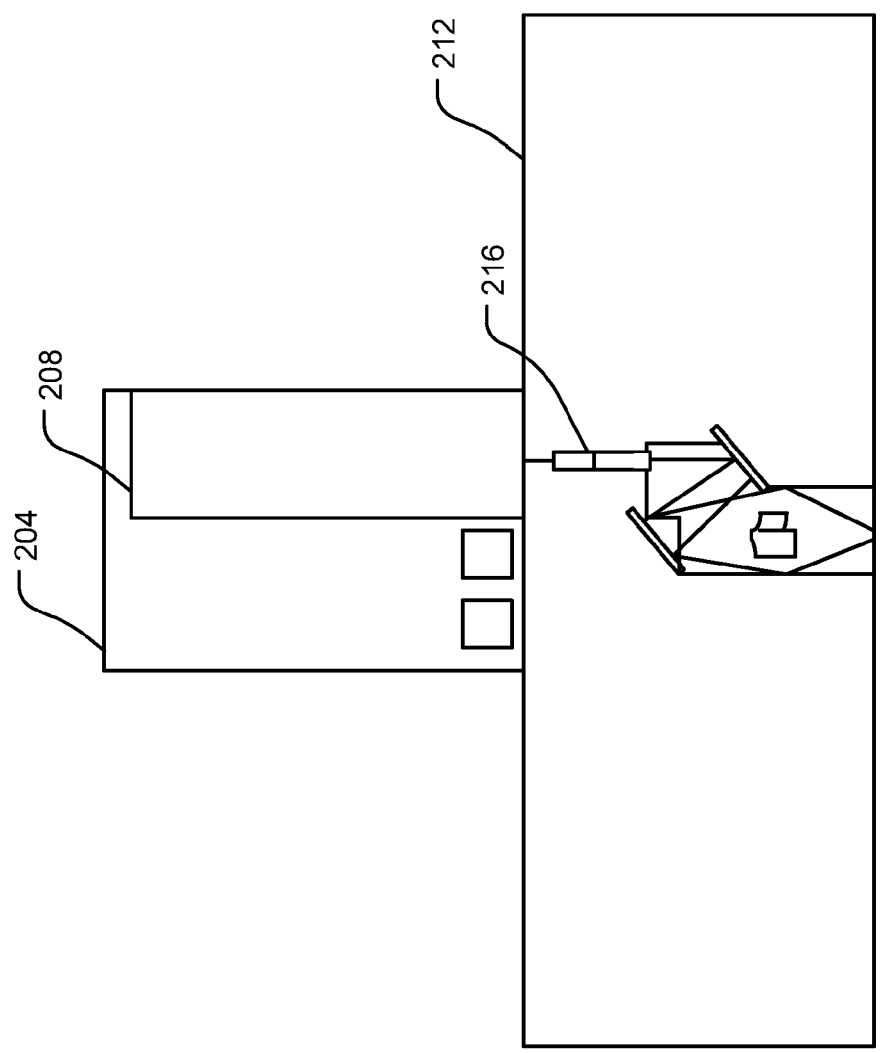
FIG. 2 illustrates an example of a laser submount assembly integrated on a slider, in accordance with one embodiment.

Referring now to FIG. 2, an example of a laser-on-slider can be seen. A laser submount 204 is shown integrated with a laser diode 208. A submount can serve as a mounting piece for the laser with respect to the slider. For example, it can be utilized to mount a laser to a slider without requiring the laser to actually touch the slider. The laser diode 208 is positioned over a waveguide 216 that is disposed within a slider 212. By choosing material with good thermal conductivity for the submount 204, the submount 204 can also serve to remove heat from the laser during operation.

Figure 3:
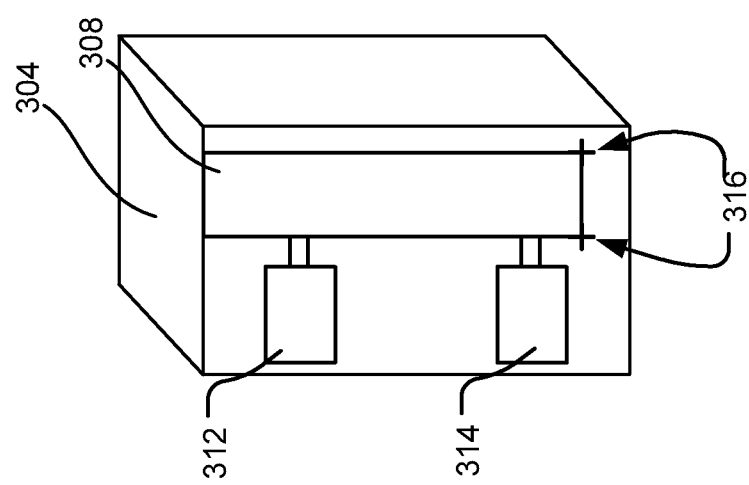
FIG. 3 illustrates an example of a submount that is configured with a portion for coupling with a laser, in accordance with one embodiment.

FIG. 3 illustrates an example of a submount that facilitates proper alignment of a laser. FIG. 3 shows a submount 304 that includes a bonding pad 308. The bonding pad can be configured in a predetermined position to facilitate integration of a laser diode to the submount. The bonding pad can be configured in the shape of the laser. One type of bonding that can be utilized is soldering. Similarly, under bump metallization may be used for the bonding pad to establish an electrical coupling with the laser diode. While FIG. 3 shows a continuous bonding pad, multiple bonding pads could alternatively be used. When multiple small pads are utilized, self alignment can be achieved via reflow.

The bonding area can be placed in a predetermined portion on the submount so that when the laser is attached at the bonding position, the laser will be in proper alignment with the waveguide during operation.

FIG. 3 also shows surface interconnect pads 312 and 314. Surface interconnect pads may be used to provide an electrical path to the laser electrode. The pads can be used as interconnect and/or probing pads. In which case, the pads can electrically connect to the laser electrodes, suspension pads, or head trailing edge pads. For example, direct wiring, wire bonding, or solder bonding can be utilized to make these further connections to the pads.

FIG. 3 also shows machine vision alignment features 316 indicated by "+" signs. The alignment features can be, for example, visual fiducials or targets. The alignment features can be particularly helpful if the placement of the laser on the submount 304 needs directed/assisted alignment in order to achieve critical alignment with the waveguide. Another example of an alignment feature is the edge of the submount itself. The edge of the submount may directly serve as such an alignment feature. Meanwhile, other features for alignment can also be included in the laser to assist the critical alignment.

In accordance with another embodiment, mechanical stops can be utilized for the alignment features. This can be particularly useful when self alignment is utilized to pull/drive the laser against the mechanical stops of the submount.

The submount itself may also utilize a bonding pad. For example an under bump metallization pad may be located on the bottom of the submount. This under bump metallization pad may be utilized to mount the submount to the slider mechanically and electrically.

Figure 4:
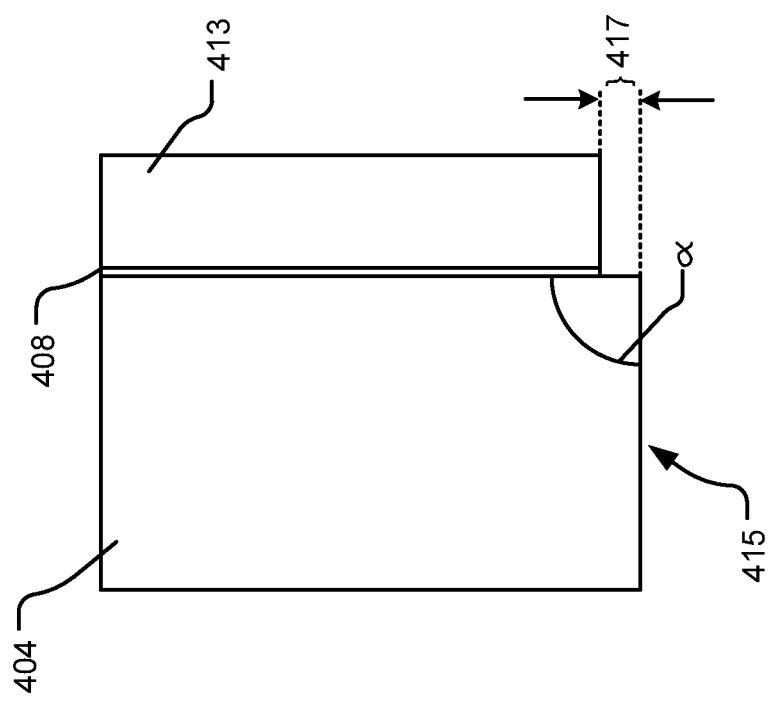
FIG. 4 illustrates an example of a submount bonded with a laser as a laser submount assembly, in accordance with another embodiment.

Referring now to FIG. 4, a side view of a submount assembly can be seen. The submount 404 is shown integrated with a laser diode 413. A soldering pad 408 is shown as the connecting mechanism between the laser and the submount. Angle "α" (alpha) is shown as the angle between the edge of the laser and the bottom of the submount. In one embodiment, an angle of 90° is preferred so that the laser directs light at the waveguide when the bottom of the submount is positioned parallel to the waveguide surface of the slider. A space 417 is shown between the bottom of the laser edge and the bottom of the submount. This can also be referred to as the laser-facet-to-submount edge. This space allows the submount to be oriented in a depression in the slider in one embodiment. The space can be a predetermined distance in order to accommodate predetermined specifications. FIG. 4 also shows an under bump metallization pad 415.

Figure 5:
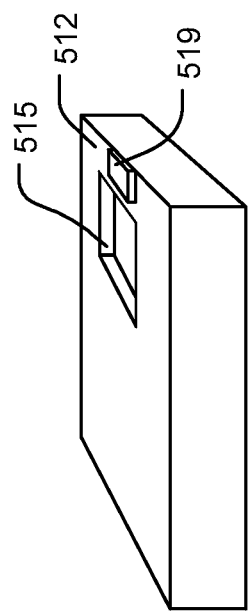
FIG. 5 illustrates an example of a slider with a portion of the slider configured to receive a submount, in accordance with one embodiment.

Referring now to FIG. 5, a slider 512 having a recessed cavity is shown. The recessed cavity can be configured to receive a laser submount assembly such as that shown in FIG. 4. The cavity 515 can receive a portion of the laser submount assembly. A plateau 519 for the waveguide is also shown as part of slider 512. Thus, when the laser submount assembly is positioned on the slider, the bottom of the laser submount assembly is disposed in cavity 515 and the laser facet edge is in juxtaposition with plateau 519. Plateau 519 can serve as the interface with a waveguide that is positioned in slider 512.

Figure 6:
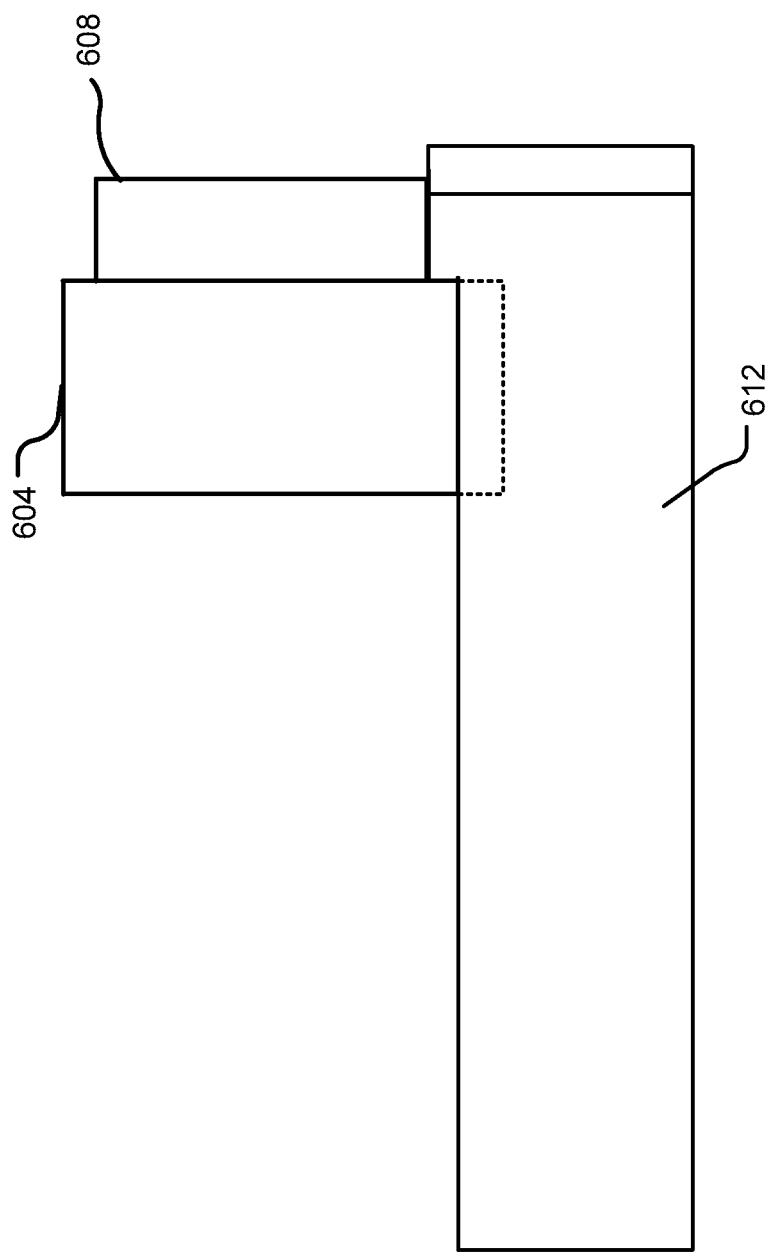
FIG. 6 illustrates an example of a laser submount assembly integrated with a slider, in accordance with one embodiment.

Referring now to FIG. 6, a submount assembly is shown integrated with a slider. Submount assembly 604 is shown having a laser 608. The submount is disposed in a cavity where it can be coupled with the slider 612 by bonding materials. The offset of the bottom of the laser from the bottom of the submount allows the laser to be positioned above the waveguide. For example, FIG. 6 shows the laser 608 positioned above the plateau for the waveguide. The dashed line shows the waveguide surface whereas the solid line shows the top of the cavity surface.

The integration of the laser submount assembly with the slider allows the path of the light emitted from the laser to be precisely aligned with the waveguide. The alignment mechanism could involve active alignment with the laser activated. Alignment could involve real-time signals (electronic, optical, etc.) for feedback through either an internal sensor built in the laser, submount, slider, or an external sensor. Alternatively, passive alignment without a real time feedback mechanism could be utilized. Passive alignment is generally preferred for higher process throughput and inherently reduced complexity. One approach to achieve passive alignment is to fabricate mechanical stops at designated locations on the slider. The cavity in FIGS. 5 and 6 is one example of such a mechanical stop. The cavity allows passive alignment of the laser submount assembly along the Z-direction. The laser submount assembly is oriented substantially perpendicular to the waveguide surface of the slider. Of course other designs are possible. And in accordance with some embodiments one may choose to utilize a non-perpendicular angle.

The examples shown in FIG. 5 and in FIG. 6 show the cavity recessed into the back of the slider opposite to the air bearing side of the slider. The cavity has one or both of X and Y dimensions smaller than that of the submount assembly so as to form a mechanical stop along the Z direction. The depth of the cavity can accommodate bonding materials, such as adhesive or solder. When the laser submount assembly is mounted to the slider, the alignment of the laser with the waveguide is passive if the laser submount assembly is pushed against and stops at the surface defined by the cavity top, for example. The force pushing the laser submount assembly can be any mechanical or external applied force combined with the adhesion force generated by bonding materials pre-disposed in the cavity. The mechanical stops along X or Y direction can be similarly fabricated.

If the laser emitting facet to submount edge spacing extends beyond the allowed spacing for laser emitting point to waveguide surface, a waveguide plateau may be fabricated by milling down other areas on the slider back. The step height of the waveguide surface to the cavity top can be configured to be sufficient to position the laser facet into a predetermined proximity with the waveguide surface.

Figure 7:
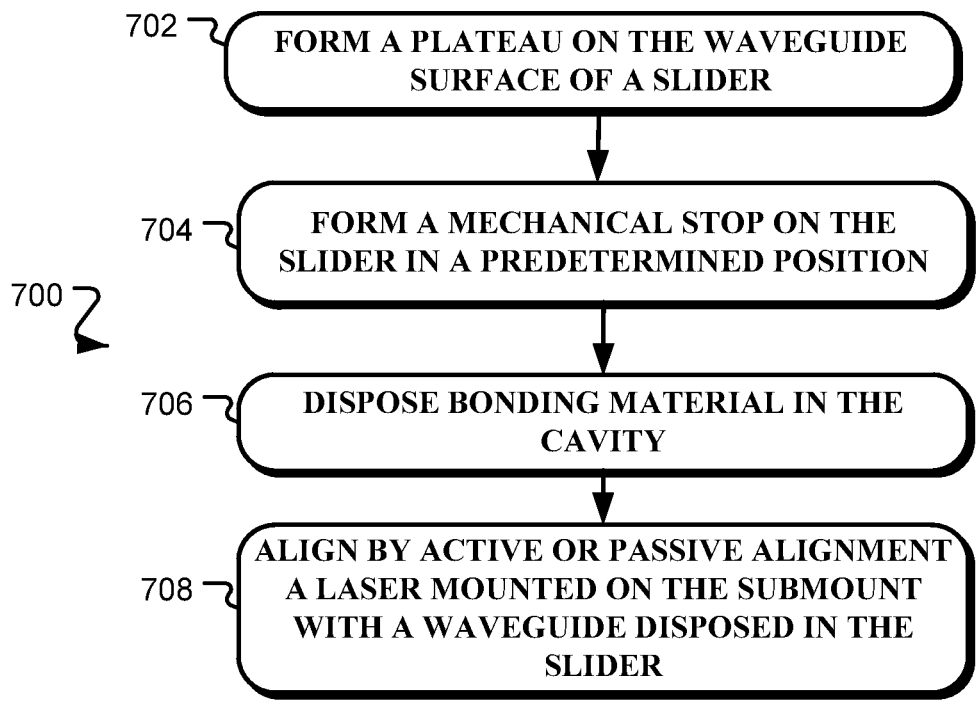
FIG. 7 illustrates a flow chart that illustrates a method of configuring a slider, in accordance with one embodiment.

Referring now to FIG. 7, a flowchart 700 is shown which illustrates a method of forming a slider in accordance with one embodiment. In operation block 702, a plateau is formed on the waveguide surface of the slider. In operation block 704, one can form a mechanical stop on a slider in a predetermined position. For example, a cavity can be formed in the slider to receive a portion of a submount. One manner of forming the cavity is to mill the surface of the slider that is opposite the air bearing surface.

One can utilize bonding materials to bond the submount assembly with the slider. This can be accomplished by disposing bonding materials in the cavity or on the submount assembly or both. Operation block 706 shows that bonding materials are disposed in the cavity in accordance with one example. The mechanical stop may also be configured in a position that allows the laser mounted on the submount to align with the waveguide disposed in the slider. This is shown by operation block 708. For example, a laser mounted on the submount may be aligned by active of passive alignment with the waveguide disposed in the slider.

It is noted that many of the structures, materials, and acts recited herein can be recited as means for performing a function or step for performing a function. Therefore, it should be understood that such language is entitled to cover all such structures, materials, or acts disclosed within this specification and their equivalents, including any matter incorporated by reference.

It is thought that the apparatuses and methods of embodiments described herein will be understood from this specification. While the above description is a complete description of specific embodiments, the above description should not be taken as limiting the scope of the patent as defined by the claims.

What is claimed is:

1. An apparatus comprising:
    a slider comprising an air bearing surface and a waveguide surface;
    a mechanical stop configured to align a submount in a predetermined position; and
    a cavity in the slider configured to receive a portion of the submount.

2. The apparatus as claimed in claim 1 and further comprising:
    bonding material disposed in the cavity for coupling the slider with the submount.

3. The apparatus as claimed in claim 1 wherein the slider comprises a waveguide disposed in the slider and wherein the mechanical stop is positioned so as to align a laser mounted on the submount with the waveguide.

4. The apparatus as claimed in claim 1 and further comprising:
    a plateau on the waveguide surface.

5. The apparatus as claimed in claim 4 wherein the plateau is configured to interface with a facet edge of a laser mounted on the submount.

6. A method comprising:
    forming a cavity on a slider for receiving a portion of a submount in a predetermined position;
    wherein the predetermined position is operative to align the submount on the slider.

7. The method as claimed in claim 6 and further comprising:
    disposing bonding material in the cavity.

8. The method as claimed in claim 6 wherein the forming the cavity comprises:
    forming the cavity in a position to align a laser mounted on a submount with a waveguide disposed in the slider.

9. The method as claimed in claim 6 and further comprising:
    forming a plateau on the waveguide surface of the slider.

* * * * *